United States Patent [19]

Pinsard et al.

[11] Patent Number: 4,561,101
[45] Date of Patent: Dec. 24, 1985

[54] CLOCK-FREQUENCY RECOVERY DEVICE ADAPTED TO HIGH-FREQUENCY RADIOCOMMUNICATIONS IN DISTURBED MEDIA

[75] Inventors: Hervé Pinsard; Claude Collin; Joël Faydit, all of Paris, France

[73] Assignee: Thomson CSF, Paris, France

[21] Appl. No.: 514,248

[22] Filed: Jul. 15, 1983

[30] Foreign Application Priority Data

Jul. 23, 1982 [FR] France ................. 82 12904

[51] Int. Cl.⁴ .................. H04L 7/00; H03D 3/24
[52] U.S. Cl. ...................... 375/108; 333/17 R; 375/119; 375/120; 455/260; 455/265
[58] Field of Search ............ 375/108, 118, 119, 120; 455/260, 265; 331/1 R, 17; 358/148, 149

[56] References Cited

U.S. PATENT DOCUMENTS

| | | | |
|---|---|---|---|
| 2,797,326 | 6/1957 | Putzrath | 331/1 R |
| 3,057,959 | 10/1962 | Rowe | 375/118 |
| 3,462,551 | 8/1969 | Fong | 178/69.5 |
| 4,215,239 | 7/1980 | Gordy et al. | 375/119 |
| 4,326,173 | 4/1982 | Newman | 331/1 A |

FOREIGN PATENT DOCUMENTS

| | | | |
|---|---|---|---|
| 18453 | 11/1980 | European Pat. Off. | 375/108 |
| 2019717 | 10/1969 | France . | |

*Primary Examiner*—Joseph A. Orsino, Jr.
*Attorney, Agent, or Firm*—Cushman, Darby & Cushman

[57] ABSTRACT

A clock-frequency recovery device applicable to digital transmission systems for radiocommunications by tropospheric or ionospheric propagation as well as from moving vehicles includes a rectification circuit, a filter circuit, a switching circuit and an output circuit comprising a delay line controlled by a phase-locked oscillator. The input of the output circuit is connected to the output of the filter circuit when the noise level of the transmission is below a predetermined threshold value. The input of the output circuit is connected to its own output when the noise level of the transmission is higher than said threshold value.

4 Claims, 2 Drawing Figures

CLOCK-FREQUENCY RECOVERY DEVICE ADAPTED TO HIGH-FREQUENCY RADIOCOMMUNICATIONS IN DISTURBED MEDIA

BACKGROUND OF THE INVENTION

1. Field of the Invention

The present invention relates to transmission of digital information in disturbed media and is concerned with a clock-frequency recovery device employed in equipment for the transmission of digital information between two terminal stations whether or not under conditions of visibility, the communication link being established in the majority of instances by tropospheric or ionospheric propagation.

Communication links of this type exhibit a propagation loss which is highly variable as a function of time. In order to ensure continuous transmission of information, it is not economically feasible and is even practically impossible in many cases to utilize equipment having a sufficient transmission margin to ensure a given minimum quality of communication in the event of occurrence of maximum propagation loss during a small percentage of time.

2. Description of the Prior Art

The expedient adopted in order to solve this difficulty consists in making use of a plurality of transmission channels in parallel, the characteristics of said channels being sufficiently different to ensure that they are not simultaneously affected by the same attenuation, or propagation loss. This has the effect of producing diversity operation in which the signals of the different channels are combined whilst weighting functions are automatically adjusted in order to obtain at each instant a quality at least equal to that of the channel which exhibits the best quality.

Since the diversity order employed is limited, there remain difficult periods of propagation, especially under conditions of tropospheric or ionospheric scatter propagation during which the demodulated and combined signal is of highly impaired quality. During short time intervals (which are subject to variation within the range of a few milliseconds to a few seconds), the signal-to-noise ratio obtained is very low and may even tend towards zero.

In point of fact, however, the demodulated and combined signal of the analog type must be regenerated in digital form. To this end, said signal is switched to two channels:

a clock-frequency recovery channel, and a regeneration channel in which regeneration is carried out by means of said recovered clock frequency.

After regeneration, the transmission equipment restitutes the two signals which it has the function of transmitting, viz:

the digital signal train containing the information, the clock signal in phase with said digital signal train.

These two signals are processed by the digital processing equipment (multiplexer, computer, and so on), the clock being usually employed for synchronization of the digital process.

Good operation of these processing equipment units is characterized by maintenance of their synchronism and will therefore depend on the quality and maintenance of the bit clock signal in the presence of severe fade-out caused by propagation.

These fading variations, or fade-out, result in the appearance of phase jitter in the bit clock signal which consequently becomes unusable beyond a certain value.

The clock-frequency recovery devices usually employed are not optimized for operation with a very low signal-to-noise ratio. Furthermore, the circuits employed frequently exhibit a threshold effect in the presence of high noise.

SUMMARY OF THE INVENTION

The present invention is concerned with a clock-frequency recovery device which continues to operate in the presence of severe fade-out and is particularly well-suited to high-frequency communications.

The present invention is such that:

the recovered clock frequency exhibits negligible phase jitter;

maintenance of the bit clock signal in the presence of interruptions of the receiver signal can reach several seconds, the resultant phase-shift being less than $\frac{1}{4}$ of a bit in order to ensure that said signal remains usable and;

return to the initial phase at the instant of reappearance of the received signal is practically instantaneous.

In accordance with the invention, a clock-frequency recovery device suited to high-frequency radio-communications in disturbed media essentially comprises an analog circuit for rectification of the received signal in order to initiate the appearance of a component in the signal at the clock frequency, the output of said analog circuit being connected to a filter circuit having a very narrow band, a switching circuit having two positions which are selected as a function of the quality of transmission, and an output circuit in which the recovered clock signal is available at the output. The switching circuit serves to connect the input of said output circuit to the output of said filter circuit when the transmission is of good quality and to connect the input of the output circuit to its own output when the transmission has a high noise level. The difference between the input and the output of said output circuit is adjusted so as to be equal to a whole number of periods of the clock signal.

BRIEF DESCRIPTION OF THE DRAWINGS

Other features of the invention will be more apparent upon consideration of the following description and accompanying drawings, wherein.

DESCRIPTION OF THE PREFERRED EMBODIMENT

Figure 1:
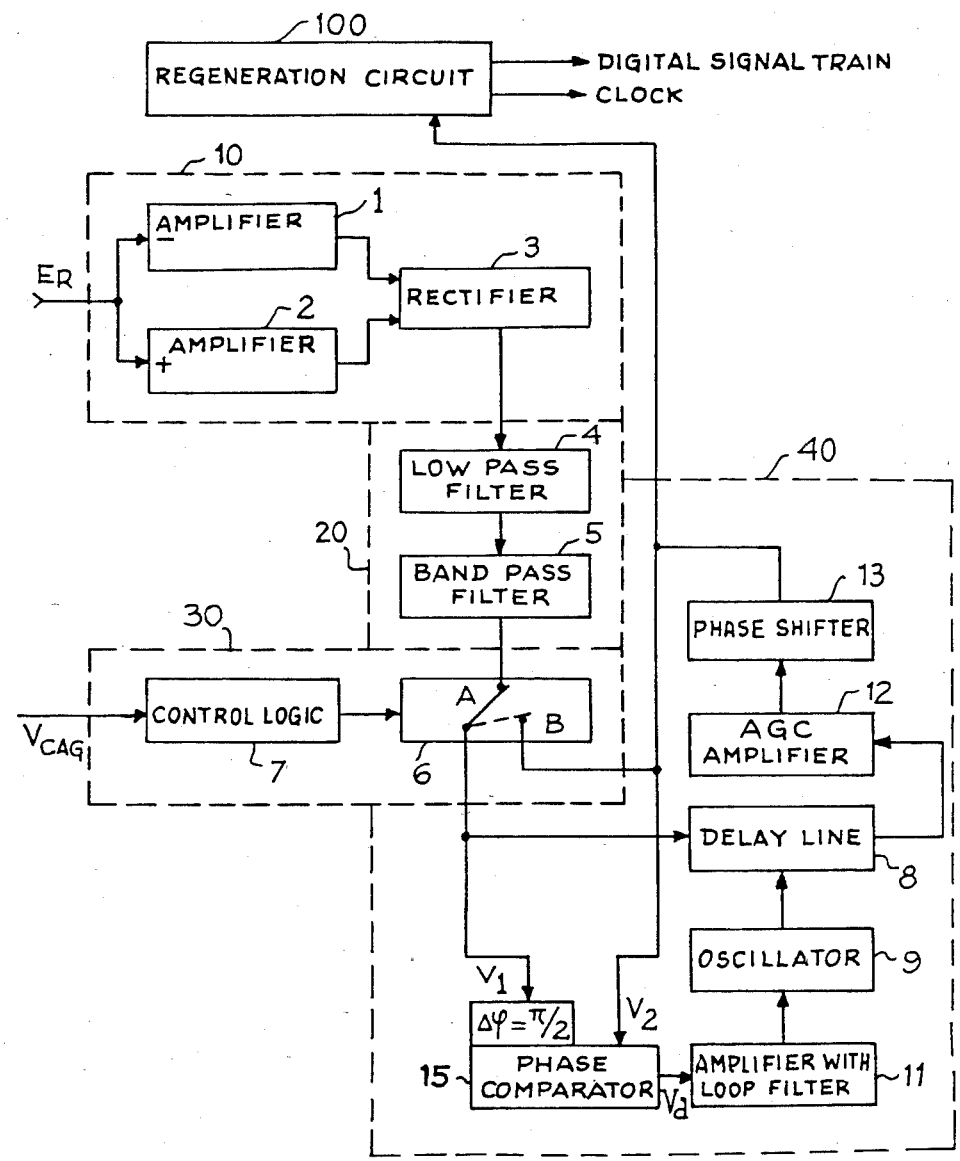
FIG. 1 represents the clock-frequency recovery device in accordance with the invention.

FIG. 1 shows the clock-frequency recovery device in accordance with the invention. Said device comprises a signal input $E_R$ to which is applied the demodulated and combined signal resulting from the combination of the received signals in a plurality of diversity channels. The signal input is connected to the input of a circuit 10 for rectification of the received signal, said circuit being provided with two linear amplifiers 1 and 2 in parallel having reversed outputs connected to the inputs of a full-wave diode rectifier 3.

In this first circuit, the pulses in the form of half-waves derived from the demodulated signal are amplified and then rectified. Energy is thus developed at the frequency corresponding to the digital rate. For example, in the case of a digital rate of 100 kbits/s, energy appears at the frequency f=100 kHz. In contrast to logic shaping circuits, this circuit does not exhibit any threshold effect. The output of the rectifier 3 is connected to a filter circuit 20 comprising a low-pass filter 4, the cutoff frequency of which is slightly higher than the clock frequency. This first filter serves to eliminate the harmonics of the clock frequency. The output of said low-pass filter 4 is connected to the input of a band-pass filter 5 having a very narrow band centered on the clock frequency. The passband of said filter is of the order of $10^{-4}$ of the clock frequency. For example in the case of a clock frequency of 100 kHz, the passband of the filter 5 is of the order of 10 Hz. This very-narrow-band filtering permits a substantial improvement in the signal-to-noise ratio at the output. In fact, the noise power is integrated in a band of only 10 Hz instead of the noise within the 100 kHz band existing at the input of the device. Said filter can be constituted for example by a quartz crystal unit employed at series resonance, tuning being performed by an adjustable series capacitor and the passband being fixed by a series resistor. The output signal of the bandpass filter 5 is therefore a sine-wave signal without any appreciable phase jitter in respect of very low signal-to-noise ratios. Furthermore, at the time of interruption of the received signal in the event of severe fade-out, for example, the signal decreases only progressively at the output of the filter by reason of the time constant of said filter associated with its very narrow passband.

During normal operation, or in other words when the signal-to-noise ratio does not fall below a threshold value, said signal serves as a reference for a phase loop. To this end, a switching circuit 30 is placed between the output of the filter circuit 20 and the input of an output circuit 40 comprising a phase-loop oscillator. Said switching circuit 30 comprises a two-position changeover switch 6 for switching the input of the circuit 40 either to the output of the circuit 20 (position A) or to the output of the circuit 40 (position B). Said changeover switch is controlled by a control logic circuit 7. Said logic circuit operates on the basis of information relating to quality of transmission in proportion to the instantaneous signal-to-noise ratio, for example the automatic gain control voltage $V_{AGC}$ of the intermediate frequency amplifier. In the case of values of the signal-to-noise ratio which are higher than a pre-established reference value $(S/B)_O$, said logic circuit places the changeover switch 6 in position A. In the case of values of the signal-to-noise ratio which are lower than $(S/B)_O$, the changeover switch moves to position B.

The input of the output circuit 40 is connected to the input of a charge-transfer delay line DTC 8 having a shift clock input connected to the output of a phase-controlled quartz oscillator 9 (VCXO), the frequency of said oscillator being equal to or adjacent to a frequency which is a multiple of the clock-signal frequency.

For the purpose of phase control of the oscillator 9, the circuit 40 comprises a phase loop including a phase comparator 15 of the analog type which is provided at one input with a $\pi/2$ phase shifter and the output of which is connected to an amplifier 11 with a loop filter. The output of said filter-amplifier is connected to the phase-control input of the oscillator 9. The output of the delay line 8 is connected to the input of an automatic gain-control amplifier or AGC amplifier 12 which delivers a constant-level signal. The output of said amplifier is connected to a phase shifter 13 which serves to compensate for the fixed phase shift between the input and output signals of the circuit 40 to within a difference of $2\pi$. When the frequency of the quartz oscillator 9 is not exactly equal to a multiple of the clock frequency, the phase shifter 13 integrates the fixed phase shift resulting from this frequency difference.

Said circuit 40 delivers the clock signal in analog form without any appreciable phase jitter. After shaping, this information is utilized for decision-making in the digital signal train regeneration circuit 100.

The operation of this system is as follows. The phase loop is characterized by its cutoff frequency or by its time constant. Its output voltage is of the form:

$$Vd = aV_1V_2 \cos \phi$$

where $V_1$ is the output voltage of the narrow-band filter 5 when the changeover switch is in position A and is the output voltage of the circuit 40 when said changeover switch is in position B, where $V_2$ is the output voltage of the circuit 40, where $\phi$ is the phase difference between the two input voltages of the comparator 10 increased by the fixed phase-shift $\pi/2$ imposed on one of the inputs.

The characteristic of the phase comparator is such that $Vd=0$ when $\phi=\pi/2$, that is to say when the phase shift between the two inputs is zero to within a difference of $2k\pi$. The delay line 8 is characterized by its time-delay $\tau=K/F$, F being the frequency of the oscillator 9. When the output voltage $V_1$ of the circuit 30 is a low-noise analog signal having a frequency equal to the clock frequency f, the changeover switch 6 is in position A. The frequency F of the oscillator is equal to $F_o$ such that:

$$\phi = \pi/2 \text{ and } Vd = 0$$

The delay line 8 accordingly has the sole function of introducing a time-delay and the clock signal at the output of the circuit 40 is in phase (to within $2 k\pi$) with the reference signal at the output of the circuit 30.

At the time of a severe fade-out, the changeover switch 6 moves to position B. At this instant, $$\phi = \pi/2 \, Vd = 0$$

The reference signal is no longer taken into account for the recovery of the clock signal, the two inputs of the phase comparator both receive the output signal of the circuit, and the delay line which is closed on itself acts as an oscillator whose frequency is equal to the clock frequency f since the condition of zero phase shift between the input and the output of the line is satisfied in respect of a control clock frequency equal to $F_o$.

Figure 2:
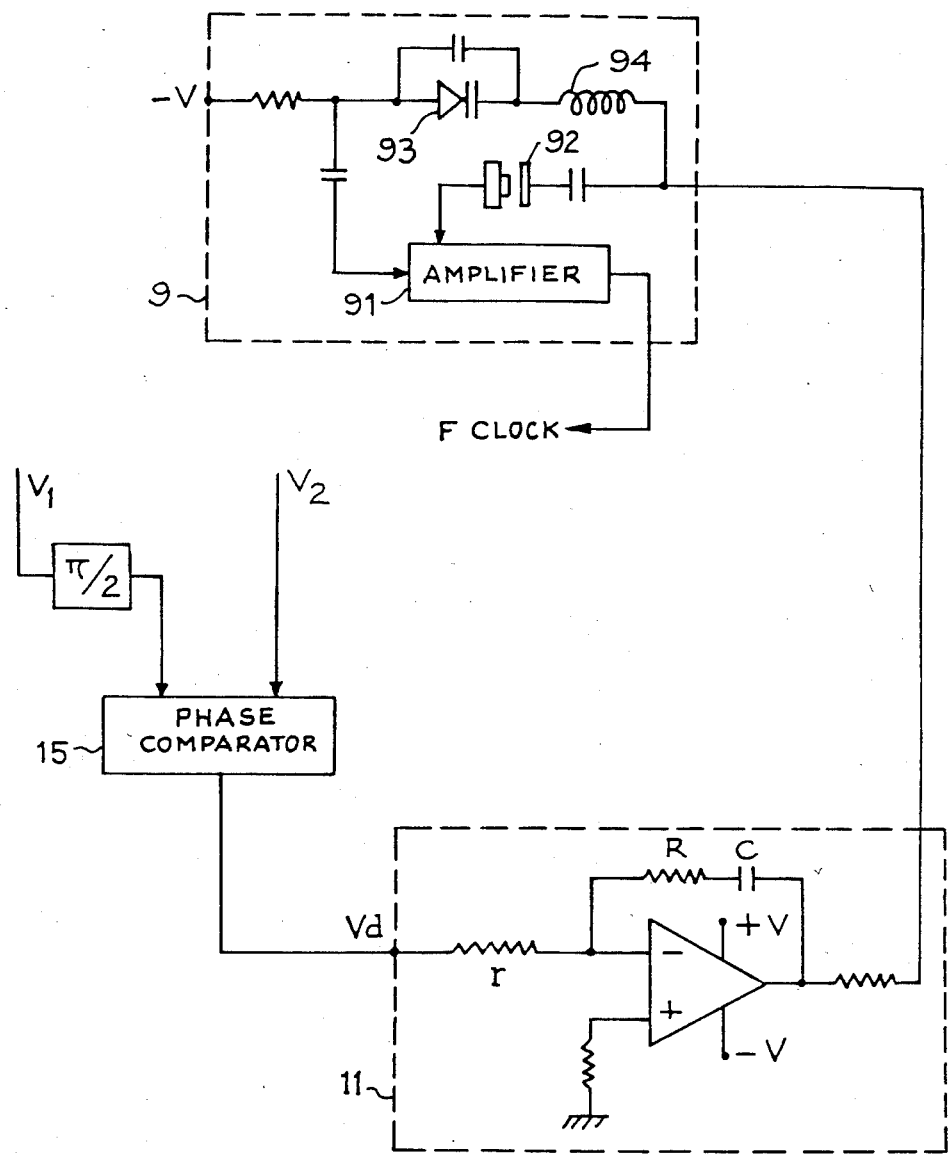
FIG. 2 is a diagram showing one form of construction of the phase loop.

FIG. 2 shows the details of one form of construction of the phase loop.

The oscillator 9 comprises an amplifier 91 associated with a quartz crystal 92. Phase control of the oscillator is carried out by a varactor 93 or in other words a diode reverse-biased by means of a supply voltage $-V$ and having a capacitance which varies with the applied voltage, the varactor being connected in series with an inductance 94. The voltage applied to the varactor for controlling the frequency of the oscillator 9 is the output voltage of the loop-filter amplifier 11. Said loop-filter amplifier 11 is a differential amplifier biased by the supply voltages $-V$ and $+V$. The error voltage $V_d$ is applied to the negative input of said amplifier via a resistor r. The output of said amplifier is connected to the same input through a circuit comprising a resistor R and a capacitor C in series, thus forming the loop filter. When an interruption occurs in the transmission, the reference signal disappears and the two inputs of the phase comparator receive the same signal. The error voltage $V_d$ is zero and the phase control no longer produces any action. However, the capacitor C has a high value of several microfarads and discharges through the reverse-biased varactor diode which has a very high resistance (several megohms). The time constant of this circuit is very high and the variation in voltage at the output of the differential amplifier remains negligible over an interval of a few seconds. In consequence, the frequency of the oscillator also remains stable, thereby producing only a small phase drift and consequently only a small phase variation at the output of the delay line 8.

The conventional method for ensuring correct operation of processing systems which follow a recovery circuit of this type usually consists in producing a phase shift in the bit clock signal which is less than one-quarter of a bit over a period of several seconds. This feature can be obtained without difficulty by means of the recovery device in accordance with the invention.

When the signal reappears after interruption of transmission, the reference signal $V_1$ is present. The control system rapidly comes into action as a result of the high loop gain (defined by the ratio R/r). The voltage $V_d$ which was very close to 0 volts at the time of cutoff attains the value a $V_1 V_2 \cos \phi$ without any voltage discontinuity. In consequence, the frequency F reverts to its nominal value $F_o$ without any discontinuity and the phase of the clock signal is restored to its nominal value.

By means of this device, the transmission equipment is therefore capable of restoring the clock frequency to the digital information processing equipment even under bad conditions of propagation.

As indicated in the foregoing, the device in accordance with the invention applies to the transmission of information in highly disturbed media and therefore applies primarily to zero-visibility communication links for tropospheric or ionospheric radiocommunications as well as to radiocommunications from moving vehicles.

What is claimed is:

1. Apparatus for recovering a clock signal of a received signal to produce a recovered clock signal, comprising:
    rectifying means for receiving said signal, rectifying it and producing a rectified signal having a component at a clock frequency of said received signal;
    means, coupled to said rectifying means, for filtering the rectified signal, said filtering means having a narrow passband;
    output means for outputting said recovered clock signal, said output means including:
    an input;
    an output supplying said recovered clock signal;
    phase comparator means, coupled to said input and to said output, for comparing phases of a signal available on said input and said recovered clock signal;
    oscillator means, coupled to said phase comparator means, for generating a clock frequency signal in response to the phase comparison;
    time-delay means, coupled to said input and to said oscillator means, for introducing a time delay to said clock frequency signal, said time delay being equal to a whole number of periods of said clock signal;
    amplifier means, coupled to said time-delay means, for providing a constant level signal; and
    phase shift means, coupled to said output and to said amplifier means, for shifting a phase of said constant level signal and providing said recovered clock signal; and
    switching means, coupled to said filter means and said input and said output, for providing the filtered rectified signal to said input when said received signal is of good transmission quality and coupling said input to said output when said received signal is of poor transmission quality.

2. Apparatus according to claim 1, wherein said oscillator means is controlled by a varactor having a high internal resistance, and wherein said phase comparator means includes a loop filter having a high-value capacitor which discharges slowly through said varactor at times of interruptions of said received signal, a signal for controlling said time-delay being derived from only a fraction of a clock period at times of interruption having a duration on the order of one second.

3. Apparatus according to claim 1, wherein said time-delay means includes a charge-transfer line.

4. Apparatus for recovering a clock signal of a received signal to produce a recovered clock signal, comprising:
    rectifying means, for receiving said signal, rectifying it and producing a rectified signal having a component at a clock frequency of said received signal;
    means, coupled to said rectifying means, for filtering the rectified signal, said filtering means having a narrow passband;
    output means for outputting said recovered clock signal, said output means including:
    an input;
    an output supplying said recovered clock signal;
    phase comparator means, coupled to said input and to said output, for comparing phases of a signal available on said input and said recovered clock signal;
    oscillator means, coupled to said phase comparator means, for generating a clock frequency signal in response to the phase comparison;
    time-delay means, coupled to said input and to said oscillator means, for introducing a time delay to said clock frequency signal, said time delay being equal to a whole number of periods of said clock signal;
    amplifier means, coupled to said time-delay means, for providing a constant level signal; and
    phase shift means, coupled to said output and to said amplifier means, for shifting a phase of said constant level signal and providing said recovered clock signal; and
    switching means, coupled to said filter means and said input and said output, said switching means including:
    a control logic circuit adapted to receive a signal indicative of the transmission quality of said received signal, and for providing a two state signal corresponding to said transmission quality; and a two-position switch responsive to said two state signal, for providing the filtered rectified signal to said input when said received signal is of good transmission quality and coupling said input to said output when said received signal is of poor transmission quality.

* * * * *